United States Patent [19]
King et al.

[11] Patent Number: 5,631,430
[45] Date of Patent: May 20, 1997

[54] METHOD AND APPARATUS FOR ENHANCED GAUGE RESOLUTION

[75] Inventors: Douglas J. King, Flint; Thomas J. Dolehanty, Gaines, both of Mich.

[73] Assignee: Delco Electronics Corporation, Kokomo, Ind.

[21] Appl. No.: 547,167

[22] Filed: Oct. 24, 1995

[51] Int. Cl.[6] .................................................. G01D 1/02
[52] U.S. Cl. ............................. 73/866.1; 364/167.01; 364/575; 364/579
[58] Field of Search ...................... 73/866.1; 364/167.01, 364/424.05, 575, 579

[56] References Cited

U.S. PATENT DOCUMENTS

| | | | |
|---|---|---|---|
| 3,633,200 | 1/1972 | Ellison et al. | 73/866.1 X |
| 3,691,845 | 9/1972 | Ladine | 73/866.1 |
| 3,889,540 | 6/1975 | Widmer | 73/866.1 |
| 4,133,039 | 1/1979 | Eichenlaub | 364/575 X |
| 4,686,510 | 8/1987 | Baker | 364/575 X |

Primary Examiner—Thomas P. Noland
Attorney, Agent, or Firm—Jimmy L. Funke

[57] ABSTRACT

An instrument cluster gauge system includes a gauge, a microcontroller for sampling a parameter value, and a low resolution digital gauge driver responsive to the microcontroller but capable of only a limited number of output drive signals corresponding to fixed gauge positions. The gauge is driven to positions between the fixed positions by rapidly alternating the drive signal between neighboring fixed positions, so that the gauge responds to the average value of the signal. An algorithm determines the relative number of each of the neighboring positions in the drive signal needed to attain an average signal near the parameter value. Smoothness and accuracy are enhanced.

10 Claims, 1 Drawing Sheet

METHOD AND APPARATUS FOR ENHANCED GAUGE RESOLUTION

FIELD OF THE INVENTION

This invention relates to driving analog gauges with digital gauge drivers and particularly to a method and apparatus for attaining gauge positions of a higher resolution than the gauge driver.

BACKGROUND OF THE INVENTION

Analog instruments in motor vehicles for indicating speed or fuel level, for example, generally use a gauge comprising an electrically driven armature which moves a pointer around a dial. An electrical analog signal proportional to the parameter measured ideally drives the pointer to an angular position representing the parameter. It is becoming a common practice to sample the various input signals by a microcontroller which then controls the respective gauges.

The microcontroller is coupled to each gauge by a respective digital driver, typically a low resolution driver which has a limited number of position outputs, so that gauge movement is incremental or step-wise rather than a smooth continuous motion. This stepping or "ticking" is particularly objectionable during slow gauge movement. The limited number of driver position outputs also requires the gauge, when stationary, to indicate one of these positions even though the input signal represents a value between two adjacent positions, thus causing a gauge error except when the input signal happens to coincide with one of the fixed positions.

SUMMARY OF THE INVENTION

It is therefore an object of the invention to obtain smooth gauge movement using a low resolution gauge driver. Another object is to increase the resolution of a digital gauge system beyond the raw resolution of the gauge driver.

The invention is carried out by rapidly oscillating the drive angle applied to the gauge between two neighboring points, such that the average position is between the neighboring points and thus can be much closer to the desired angle. The mechanical gauge movement does not respond instantaneously to each drive command and thus performs a filtering or averaging action. The neighboring point nearest the desired point is invoked more often than the farthest one to bias the gauge to the desired angle.

A continuously repeated algorithm in the microcontroller determines which drive angle of the two neighboring points shall be applied at each iteration such that, over time, the average of the points will be very near the desired position. The algorithm commands reading the input signal and the desired angle requested by the input signal is expressed as a value which is M times the driver precision. A remainder determined by the previous iteration is added to the angle, and the result is divided by the value M. The integer portion of the dividend determines which drive angle shall be applied. A new remainder is calculated and the algorithm is repeated. In this way the two neighboring drive angles are applied in proportion to the proximity of the desired angle. The result is that the gauge can move to many positions between those normally afforded by the gauge driver to more accurately reflect the input signal. In the same way, when the input is slowly changing, the gauge, instead of jumping from one position to another, can move to intermediate points as well to more smoothly traverse the gauge range.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description is directed to a scheme for enhancing gauge smoothness and accuracy developed specifically for automotive gauges such as a fuel level gauge, a speedometer, and the like. It will be recognized, however, that the invention is not limited to such automotive uses but can be applied where improved gauge accuracy is desired in microcontroller driven gauges.

Figure 1:
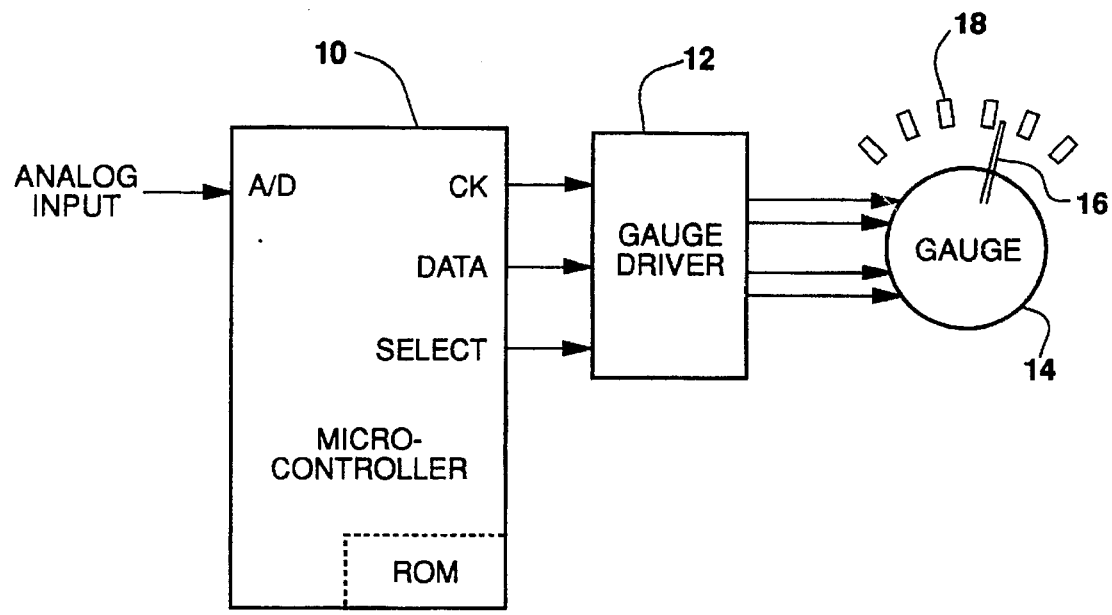
FIG. 1 is a block diagram of a gauge and its drive system for carrying out the invention.

Referring to FIG. 1, an analog input from a speed sensor or a fuel level sensor, for example, is connected to the A/D input of a microcontroller 10 which has a serial clock output, a data output and a chip select output. The outputs are carried by separate buses to a gauge driver 12 which in turn has two pairs of outputs coupled to a gauge 14. The gauge has a pointer 16 which sweeps across a dial 18 to indicate fuel level or vehicle speed. The microcontroller includes a ROM or other memory which stores programs for operating the control including an algorithm for enhancing gauge smoothness and accuracy.

The microcontroller 10 causes the input signal to be read and develops a digital output which represents the magnitude of the input signal within the resolution permitted by the gauge driver. The gauge driver 12 converts the digital signal to sine and cosine waveforms to drive the gauge pointer through an angle to the desired position, subject to the delay of gauge movement. If desired, the gauge driver function could be incorporated into the microcontroller.

Since the gauge driver is digital it inherently has a limited number of fixed gauge positions which it can control to. Thus a 10 bit driver would have 1024 fixed gauge positions, and if these were distributed over 360 degrees the positions would be spaced about 0.35 degrees apart. The effective resolution can be made much finer by controlling the gauge to points between the fixed gauge positions. This is accomplished by reading the desired gauge position from the input signal and expressing the position with a resolution greater than that of the gauge driver, and energizing the driver circuit to alternately supply signals for the two discrete gauge positions nearest the desired position. When this algorithm is repeated rapidly the signals are averaged by the gauge to achieve the desired gauge position. A repetition every 7.8 msec has been found to be suitable.

In greater detail the algorithm is as follows:
1. START
2. READ THE INPUT SIGNAL
3. DETERMINE THE DESIRED ANGLE (WITH M TIMES THE PRECISION OF THE GAUGE DRIVER)
4. SET DESIRED ANGLE=DESIRED ANGLE+REMAINDER
5. CALCULATE REMAINDER=DESIRED ANGLE MOD M
6. GAUGE POSITION =DESIRED ANGLE DIV M
7. DRIVE GAUGE TO GAUGE POSITION

8. REPEAT STEPS 4–7 AT A FIRST RATE AND STEPS 2–3 AT A SECOND RATE where DIV is an integer division operator and any remainder is truncated, and MOD is the mathematical operator modulo which returns the remainder after a division operation. The first and second rates may be equal, however satisfactory results are obtained at a second rate at, say, one fifth the first rate to greatly reduce microcontroller burden.

As an example, assume a 10 bit gauge driver, M is equal to 32, and the previous remainder is 25. A full scale reading would then be 32768. If in step 3 the desired angle is determined (by digitizing the input signal) to be 3000, step 4 will yield a desired angle of 3025. The calculated remainder in step 5 will be 3025 MOD 32=17. In step 6 the gauge position is the integer value of 3025 DIV 32=94 and the gauge will be driven to that value (the 94th increment from zero). In the next iteration, the desired angle (step 4) will be 3017, the new remainder will be 9, and the gauge position will still be 94. After many iterations for the same input signal the algorithm will yield three times as many 94 values as 93 values which the gauge averages to 93.75, which is between the fixed gauge positions 93 and 94.

Figure 2:
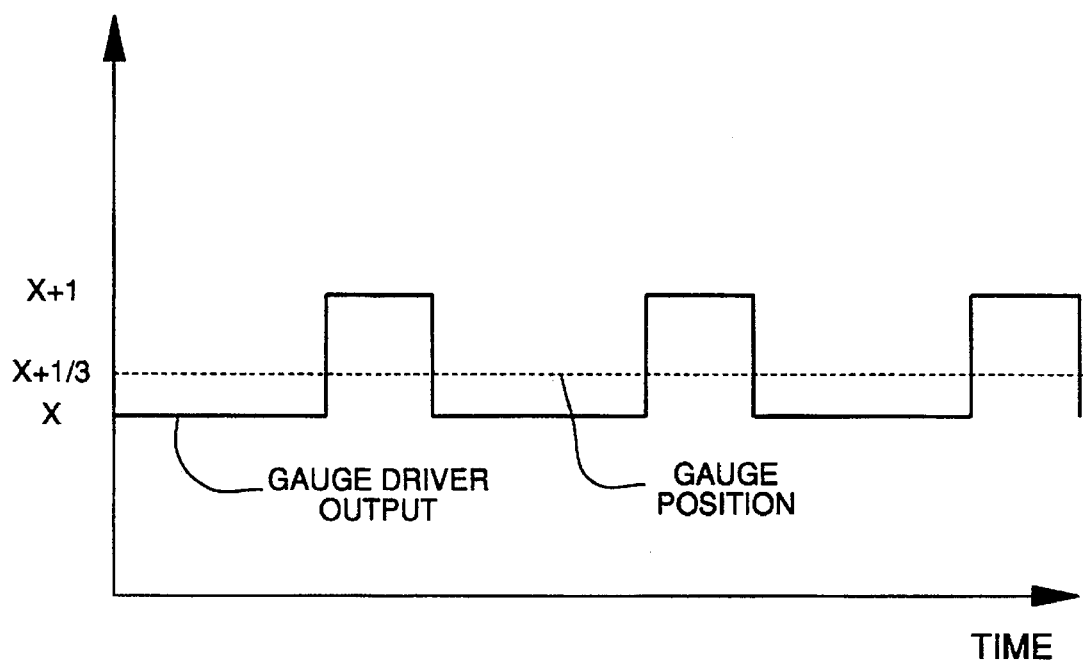
FIG. 2 is a graph of a waveform of applied gauge angles and the average value.

A simplified form of the gauge operation is shown in FIG. 2 which covers a period of several algorithm iterations where adjacent fixed gauge positions are x and x+1, and M equals 3. For an input signal requesting a gauge position of x+⅓, the drive angle output by the gauge driver is x two-thirds of the time and x+1 one-third of the time so that the gauge assumes the average position of x+⅓.

The above operations are best implemented in a microcontroller by setting the value M to $2^N$, carrying out the DIV operation by shifting the binary value of the desired angle N positions to the right, and executing the MOD operator by a bitwise AND operation on the binary value of the desired angle and $(2^N-1)$. Then the algorithm becomes:

1. START
2. READ THE INPUT
3. DETERMINE THE DESIRED ANGLE (WITH $2^N$ TIMES PRECISION OF THE GAUGE DRIVER)
4. SET DESIRED ANGLE=DESIRED ANGLE+ REMAINDER
5. CALCULATE REMAINDER=DESIRED ANGLE AND $(2^N-1)$
6. GAUGE POSITION=DESIRED ANGLE SHIFTED RIGHT N TIMES
7. DRIVE GAUGE TO THE GAUGE POSITION
8. REPEAT STEPS 4–7 AT A FIRST RATE AND STEPS 2–3 AT A SECOND RATE

It will thus be seen that the algorithm of either form disclosed here is simple in execution and yet greatly enhances gauge operation by allowing physical gauge position between the fixed angles of the driver output. This results in more accurate gauge indications when the input is a steady state signal and smooth movements when the input is slowly changing. The incorporation of the relatively simple algorithm thus permits the operation of an expensive gauge system to be mimicked by less expensive hardware.

The embodiments of the invention in which an exclusive property or privilege is claimed are defined as follows:

1. In a gauge having a limited resolution digital driver circuit limited to producing drive signals for discrete gauge positions, and a microcontroller for receiving an input signal and supplying drive data to the driver circuit, a method of controlling the gauge to points between the discrete positions comprising the steps of:

reading a desired gauge position from the input signal and expressing the position with a resolution greater than that of the gauge driver; and energizing the driver circuit to alternately supply signals for the two discrete gauge positions nearest the desired position, whereby the signals are averaged by the gauge to achieve the desired gauge position.

2. The invention as defined in claim 1 wherein the frequency of occurrence of the signals for the respective discrete positions is prorated according to the proximity of the desired gauge position to each of the two discrete positions.

3. The invention as defined in claim 1 wherein the energizing step includes:

repetitively executing an algorithm for calculating drive data representing the two discrete gauge positions, wherein for a constant input signal the two positions occur in proportion to their respective proximity to the desired position.

4. The invention as defined in claim 1 wherein the energizing step includes iteratively:

a) reading the input signal to determine the desired position at a precision which is a multiple M of the driver precision, b) summing the desired position with a remainder determined in a previous iteration to obtain a new position, c) calculating a new remainder for use in the next iteration, d) dividing the new position by the multiple M and saving the integral portion of the dividend which represents one of the two discrete gauge positions, e) driving the gauge by the integral portion of the dividend, and f) repeating the steps b) through e) at a first rate and step a) at a second rate, the second rate being equal to or less than the first rate.

5. The invention as defined in claim 4 wherein:

the calculating step comprises calculating remainder=(the desired position) MOD M; and the dividing step includes the operation (the desired position) DIV M, where the DIV operator yields the integral portion of the dividend.

6. The invention as defined in claim 4 wherein the multiple M is $2^N$ and:

the calculating step comprises the operation (the desired position) AND $(2^N-1)$, where AND is a bitwise operation on binary values; and the dividing step comprises shifting the binary value of the desired position to the right N times.

7. Apparatus for enhancing gauge resolution comprising:

a microcontroller for receiving an input signal and supplying drive data corresponding to the value of the input signal;

a gauge driver comprising a limited resolution digital circuit coupled to the microcontroller for receiving the drive data for producing gauge drive signals for discrete positions;

the microcontroller being programmed to read a desired gauge position from the input signal and express the position with a resolution greater than that of the gauge driver, and energize the driver circuit to alternately supply signals for the two discrete gauge positions nearest the desired position; and a gauge driven by the gauge driver to average the signals for the two discrete gauge positions to achieve the desired gauge position.

8. The invention as defined in claim 7 wherein the microcontroller is programmed to produce signals for the respective discrete positions which are prorated to occur according to the proximity of the desired angle to each of the two discrete positions.

9. The invention as defined in claim 7 wherein the microcontroller is programmed to iteratively perform an algorithm to:

a) read the input signal to determine the desired position at a precision which is a multiple M of the driver precision, b) sum the desired position with a remainder determined in a previous iteration to obtain a new position, c) calculate a new remainder for use in the next iteration, d) divide the new position by the multiple M and save the integral portion of the dividend which represents one of the two discrete gauge positions, e) drive the gauge by the integral portion of the dividend, and f) repeat the operations b) through e) at a first rate and operation a) at a second rate, the second rate being equal to or less than the first rate.

10. The invention as defined in claim 9 wherein the multiple M is $2^N$ and:

the new remainder is calculated by a bitwise AND operation on the binary values of the desired angle and $(2^N-1)$; and the divide operation comprises shifting the binary value of the desired position to the right N times.

* * * * *